United States Patent
Inoue

(10) Patent No.: US 7,307,484 B2
(45) Date of Patent: Dec. 11, 2007

(54) SEMICONDUCTOR INTEGRATED CIRCUIT DEVICE WITH NOISE REDUCTION FUNCTION

(75) Inventor: Hiroaki Inoue, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 437 days.

(21) Appl. No.: 11/097,264

(22) Filed: Apr. 4, 2005

(65) Prior Publication Data

US 2005/0277394 A1 Dec. 15, 2005

(30) Foreign Application Priority Data

Jun. 10, 2004 (JP) .............................. 2004-172251

(51) Int. Cl.
*H03B 1/04* (2006.01)
*H04B 1/10* (2006.01)

(52) U.S. Cl. .................... 331/105; 331/108 C; 455/303

(58) Field of Classification Search ................ 331/105, 331/108 C; 455/303
See application file for complete search history.

(56) References Cited

U.S. PATENT DOCUMENTS 7,132,900 B2 * 11/2006 Yahagi et al. ........... 331/108 C

FOREIGN PATENT DOCUMENTS

| JP | 11-234153 | 8/1999 |
|---|---|---|
| JP | 2000-269793 | 9/2000 |
| JP | 2001-125744 | 5/2001 |

* cited by examiner

*Primary Examiner*—Robert Pascal
*Assistant Examiner*—James Goodley
(74) *Attorney, Agent, or Firm*—Rabin & Berdo, P.C.

(57) ABSTRACT

A semiconductor integrated circuit device includes a semiconductor substrate; at least one integrated circuit block formed in the semiconductor substrate; a first electrode pad which receives a first clock, the first electrode pad being disposed on the semiconductor substrate; a wiring line which electrically connects the integrated circuit block and the first electrode pad, the wiring line being disposed on the semiconductor substrate; and a second electrode pad which receives a second clock having the same frequency as and opposite polarity from the first clock, the second electrode pad being disposed in a position adjacent to the first electrode pad on the semiconductor substrate and isolated from the integrated circuit block.

7 Claims, 8 Drawing Sheets

SEMICONDUCTOR INTEGRATED CIRCUIT DEVICE WITH NOISE REDUCTION FUNCTION

BACKGROUND OF THE INVENTION

1. Field of the Invention

The present invention relates to a signal processing apparatus such as an FM multiplex data processing apparatus used in a VICS (Vehicle Information and Communication System) FM multiplex broadcast receiver and the like, and a semiconductor integrated circuit device incorporated into the signal processing apparatus, and in particular, to a clock noise reducing technique used in a semiconductor integrated circuit device such as an LSI analog filter circuit.

2. Description of the Related Art

FIG. 6 is a diagram showing a configuration of a conventional FM multiplex broadcast receiver for decoding VICS-FM multiplex data. An FM multiplex data processing apparatus 31 shown in FIG. 6 includes an analog filter IC 34, a VICS logic IC 35, and a microcontroller 36. The analog filter IC 34 extracts a VICS digital signal BPFO from an FM baseband signal (FM multiplex signal) containing multiplex data received through an FM antenna 2 and an FM tuner 3. The VICS logic IC 35 receives and decodes the digital signal BPFO output from the analog filter IC 34. The microcontroller 36 takes out and processes VICS data output from the VICS logic IC 35. The VICS-FM multiplex broadcast receiver is disclosed, for example, in Japanese Patent Kokai (Laid-open) Publication No. 11-234153.

FIG. 7 is a diagram showing a configuration of the analog filter IC 34 shown in FIG. 6. As shown in FIG. 7, the analog filter IC 34 includes a semiconductor integrated circuit component (IC chip) 40, a plurality of lead terminals (for inputting or outputting the signals BPFCLK, AIN, SG, and BPFO), and bonding wire terminals 41a, 43a, 44a, and 52a for connecting the lead terminals and electrode pads 41, 43, 44, and 52 of the IC chip 40. The electrode pad 41 of the analog filter IC 34 is supplied with a single-phase clock of 2 MHz, for instance, from the VICS logic IC 35. The IC chip 40 includes a variety of integrated circuit blocks formed on a semiconductor substrate, such as a low-pass filter (LPF) 43, an amplifier circuit (Amp) 46, a band-pass filter (BPF) 47 including a switched capacitor (SC) filter, an amplifier circuit (Amp) 48, a delay detection circuit (1/T) 49, a low-pass filter (LPF) 50, and an amplifier circuit (Amp) 51. The low-pass filter 43, the amplifier circuit 46, the band-pass filter 47, and the amplifier circuit 48 function as a filter block for extracting a digital signal of 76 kHz±4 kHz modulated by level-controlled minimum shift keying (LMSK) from the FM multiplex signal AIN, for instance. The delay detection circuit 49, the low-pass filter 50, and the amplifier circuit 51 function as a delay detection block for reproducing a 16 kbit/s digital signal BPFO from the LMSK-modulated digital signal, for instance.

In the analog filter IC 34 to which the single-phase clock BPFCLK is supplied from the VICS logic IC 35, however, parasitic capacitances Cp1, Cp2, Cp3, and Cp4, shown in FIG. 8, between the electrode pad 41 of the IC chip 40 and the integrated circuit blocks 45, 47, 49, and 50 respectively cause noise, which adversely affects the operating characteristics of the low-pass filters 45 and 50 and the band-pass filter 47. The effect of noise on the circuit characteristics is very large in a circuit having a capacitor which can temporarily float and has a relatively small capacitance. Incidentally, reduction of the effect of a noise signal is disclosed, for example, in Japanese Patent Kokai (Laid-open) Publication No. 2001-125744, and measures against stray capacitance are disclosed, for example, in Japanese Patent Kokai (Laid-open) Publication No. 2000-269793.

SUMMARY OF THE INVENTION

An object of the present invention is to provide a semiconductor integrated circuit device, a signal processing apparatus, and an FM multiplex data processing circuit that can reduce the effect of clock noise.

According to an aspect of the present invention, a semiconductor integrated circuit device includes a semiconductor substrate; at least one integrated circuit block formed in the semiconductor substrate; a first electrode pad which receives a first clock, the first electrode pad being disposed on the semiconductor substrate; a wiring line which electrically connects the integrated circuit block and the first electrode pad, the wiring line being disposed on the semiconductor substrate; and a second electrode pad which receives a second clock having the same frequency as and opposite polarity from the first clock, the second electrode pad being disposed in a position adjacent to the first electrode pad on the semiconductor substrate and isolated from the integrated circuit block.

According to another aspect of the present invention, a signal processing apparatus includes a first semiconductor integrated circuit device having the same structure as the above-mentioned semiconductor integrated circuit device; a second semiconductor integrated circuit device which outputs the first clock and the second clock; a first clock wiring line for supplying the first clock from the second semiconductor integrated circuit device to the first lead terminal of the first semiconductor integrated circuit device; and a second clock wiring line for supplying the second clock from the second semiconductor integrated circuit device to the second lead terminal of the first semiconductor integrated circuit device.

According to yet another aspect of the present invention, an FM multiplex data processing apparatus includes a first semiconductor integrated circuit device having the same structure as the above-mentioned semiconductor integrated circuit device; a second semiconductor integrated circuit device which outputs the first clock and the second clock; a first clock wiring line for supplying the first clock from the second semiconductor integrated circuit device to the first lead terminal of the first semiconductor integrated circuit device; and a second clock wiring line for supplying the second clock from the second semiconductor integrated circuit device to the second lead terminal of the first semiconductor integrated circuit device. The first semiconductor integrated circuit device includes an analog filter circuit for extracting digital data from an FM baseband signal containing multiplex data, and the second semiconductor integrated circuit device includes a decoder for decoding the digital data extracted by the analog filter circuit.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Further scope of applicability of the present invention will become apparent from the detailed description given hereinafter. However, it should be understood that the detailed description and specific examples, while indicating preferred embodiments of the invention, are given by way of illustration only, since various changes and modifications will become apparent to those skilled in the art from the detailed description.

Figure 1:
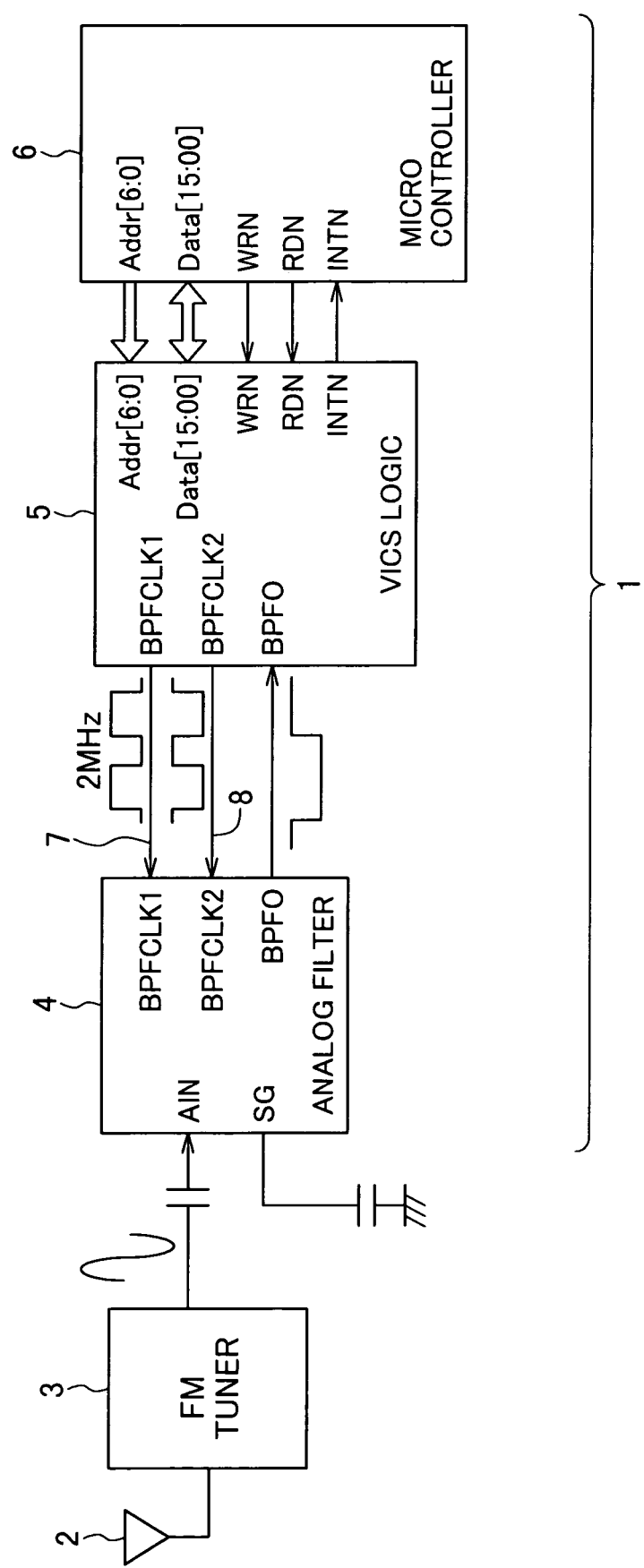
FIG. 1 is a diagram showing a configuration of an FM multiplex broadcast receiver according to an embodiment of the present invention.

FIG. 1 is a diagram showing a configuration of an FM broadcast receiver for decoding VICS-FM multiplex data, according to an embodiment of the present invention. As shown in FIG. 1, an FM multiplex data processing apparatus 1 includes an analog filter IC 4, a VICS logic IC 5, and a microcontroller 6. The analog filter IC 4 extracts a VICS digital signal from an FM baseband signal (FM multiplex signal) AIN containing multiplex data, received through an FM antenna 2 and an FM tuner 3. The VICS logic IC 5 receives and decodes a digital signal BPFO output from the analog filter IC 4. The microcontroller 6 takes out the VICS data from the VICS logic IC 5 and processes the data. In FIG. 1, a reference numeral 7 denotes a first clock wiring line for supplying a first clock BPFCLK1 from the VICS logic IC 5 to a first lead terminal (which is denoted by a reference numeral 61 in FIG. 2 and FIG. 3) of the analog filter IC 4. A reference numeral 8 denotes a second clock wiring line for supplying a second clock BPFCLK2 from the VICS logic IC 5 to a second lead terminal (which is denoted by a reference numeral 62 in FIG. 2 and FIG. 3) of the analog filter IC 4.

Figure 2:
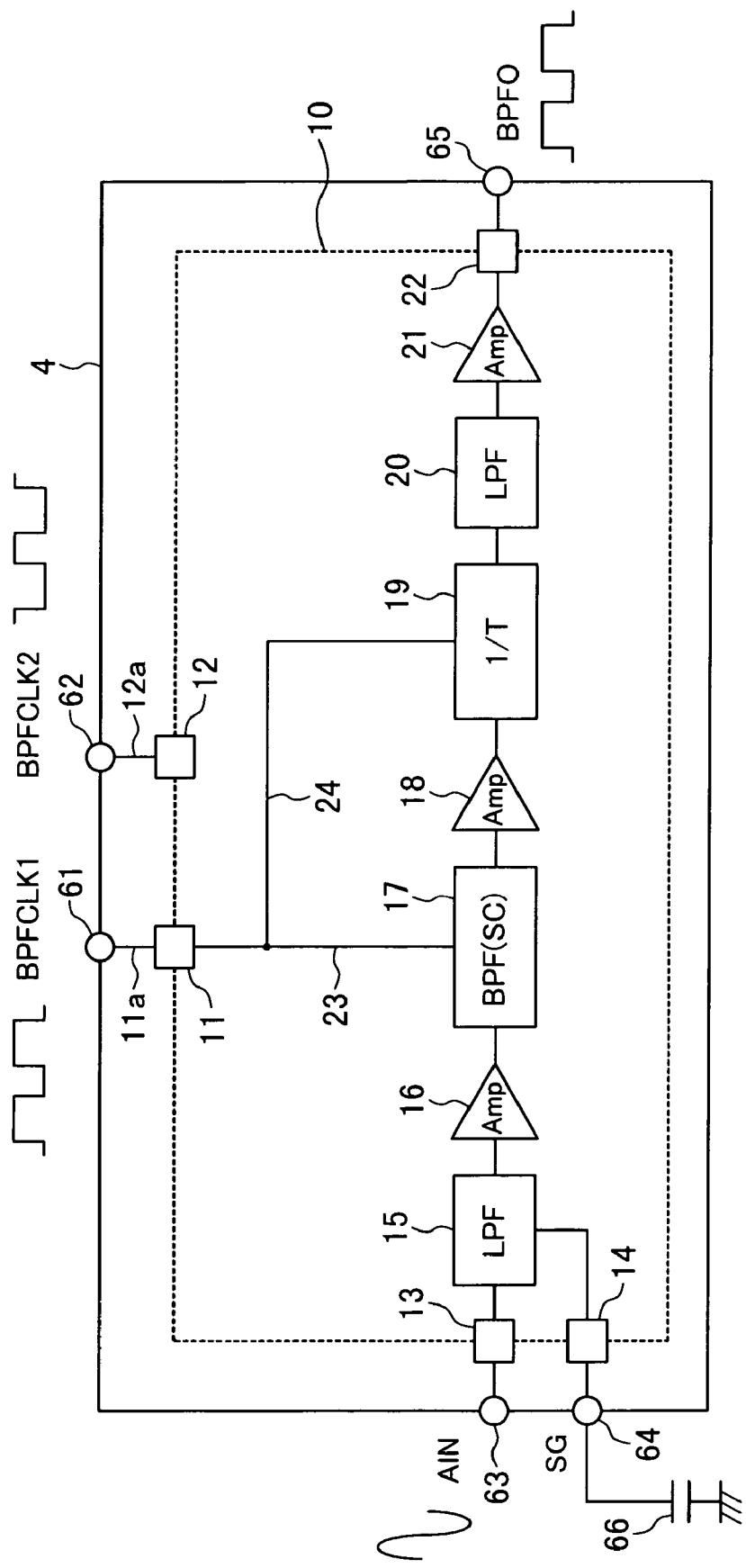
FIG. 2 is a diagram showing a configuration of the analog filter IC shown in FIG. 1.

FIG. 2 is a diagram showing a configuration of the analog filter IC 4 shown in FIG. 1. As shown in FIG. 2, the analog filter IC 4 includes a semiconductor integrated circuit component (IC chip) 10, lead terminals 61 to 65, and bonding wire terminals 11a, 12a, 13a, 14a, and 22a for connecting the lead terminals 61 to 65 and the electrode pads 11, 12, 13, 14, and 22 of the IC chip 10. The analog filter IC 4 is supplied with the first clock BPFCLK1 (of 2 MHz, for instance) and the second clock BPFCLK2 from the VICS logic IC 5. The second clock BPFCLK2 has the same frequency as and opposite polarity from the first clock signal BPFCLK1, and is usually an inversion of the first clock BPFCLK1.

In the analog filter IC 4 shown in FIG. 1 and FIG. 2, AIN denotes an FM multiplex signal input through the lead terminal 63, and SG denotes a reference analog voltage of the lead terminal 64 grounded through a noise suppression capacitor 66. In the analog filter IC 4 shown in FIG. 1 and FIG. 2, BPFCLK1 denotes the first clock input to the first lead terminal 61, BPFCLK2 denotes the second clock input to the second lead terminal 62, and BPFO denotes the digital signal output from the lead terminal 65.

In the VICS logic IC 5 shown in FIG. 1, BPFCLK1 denotes the first clock output from the VICS logic IC 5, BPFCLK2 denotes the second clock output from the VICS logic IC 5, and BPFO denotes the digital signal input to the VICS logic IC 5. In the VICS logic IC 5 and the microcontroller 6 shown in FIG. 1, Addr denotes an address signal sent to an internal register (not shown) of the VICS logic IC 5, and Data denotes a data bus signal sent to another internal register (not shown) of the VICS logic IC 5. In the VICS logic IC 5 and the microcontroller 6 shown in FIG. 1, WRN denotes a write signal sent to an internal register (not shown) of the VICS logic IC 5, RDN denotes a read signal sent to another internal register (not shown) of the VICS logic IC 5, and INTN denotes an interrupt signal sent to the microcontroller 6.

The IC chip 10 includes different types of integrated circuit blocks formed on a semiconductor substrate, such as a low-pass filter (LPF) 15, an amplifier circuit (Amp) 16, a band-pass filter (BPF) 17 containing a switched capacitor (SC) filter, an amplifier circuit (Amp) 18, a delay detection circuit (1/T) 19, a low-pass filter (LPF) 20, and an amplifier circuit (Amp) 21. The first clock BPFCLK1 is supplied through wiring lines 23 and 24 to the band-pass filter 17 and the delay detection circuit 19. The low-pass filter 15, the amplifier circuit 16, the band-pass filter 17, and the amplifier circuit 18 function as a filter block for extracting an LMSK-modulated digital signal of 76 kHz±4 kHz from the FM multiplex signal AIN, for instance. The delay detection circuit 19, the low-pass filter 20, and the amplifier circuit 21 function as a delay detection block for reproducing a 16 kbit/s digital signal BPFO from the LMSK-modulated digital signal, for instance.

Figure 3:
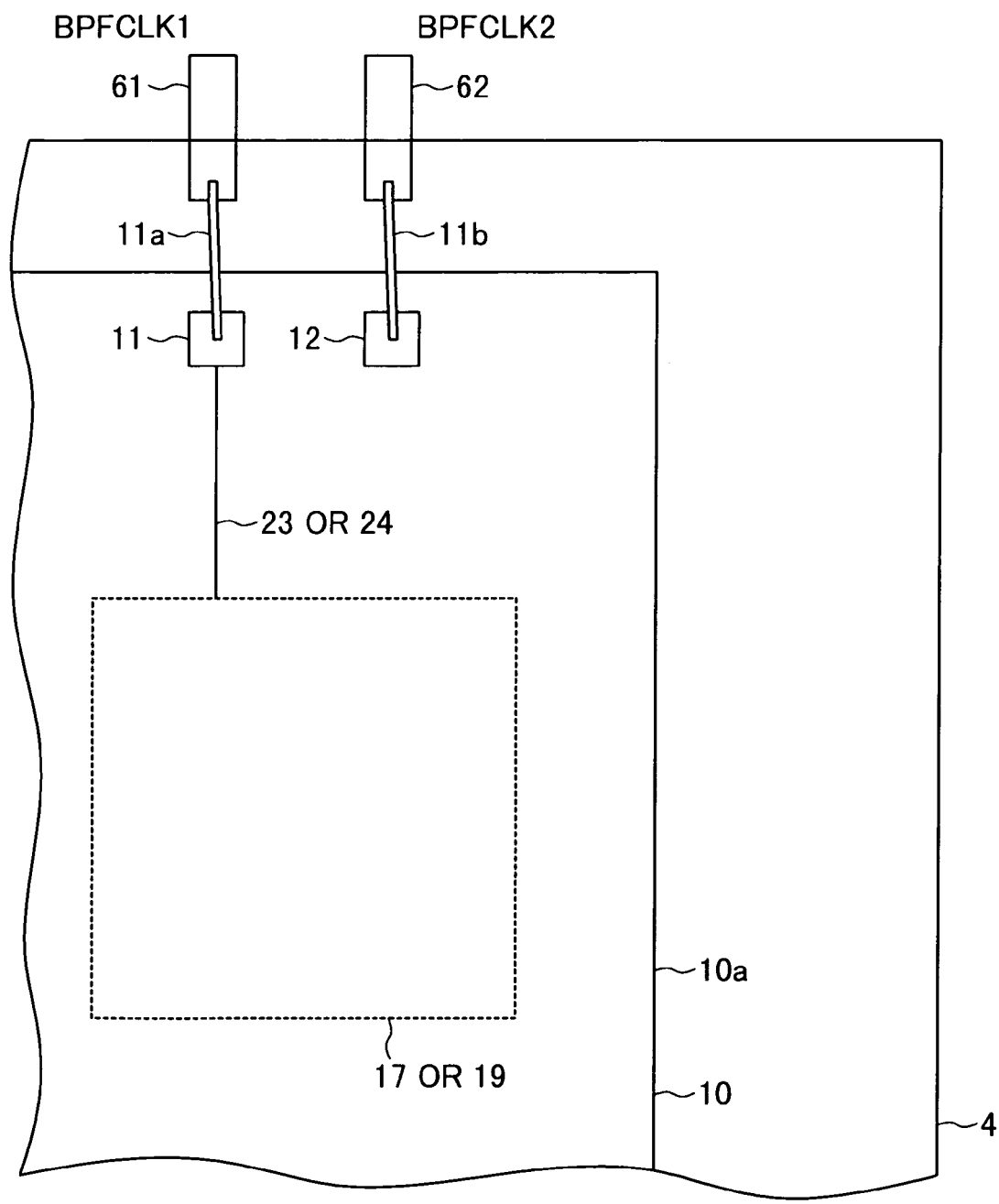
FIG. 3 is a schematic diagram showing a part of layout of the analog filter IC shown in FIG. 1.

FIG. 3 is a schematic diagram showing a part of layout of the analog filter IC 4 shown in FIG. 1. As shown in FIG. 3, the semiconductor integrated circuit device 4 includes a semiconductor substrate 10a, an integrated circuit block 17 (or 19) formed in (or on) the semiconductor substrate 10a, a first electrode pad 11, a wiring line 23 (or 24), and a second electrode pad 12. The first clock BPFCLK1 is supplied through the first lead terminal 61 and the first bonding wire 11a to the first electrode pad 11. The wiring line 23 (or 24) connects the integrated circuit block 17 (or 19) and the first electrode pad 11. The second electrode pad 12 is disposed in a position adjacent to the first electrode pad 11 on the semiconductor substrate 10a, and is isolated from (that is, not connected to) the integrated circuit block 17 or 19. The second clock BPFCLK2, which has the same frequency as and opposite polarity from the first clock BPFCLK1, is supplied through the second lead terminal 62 and the second bonding wire 12a to the second electrode pad 12. The inside of the first lead terminal 61, the inside of the second lead terminal 62, the first bonding wire 11a, the second bonding wire 11b, the semiconductor substrate 10a, and the components on the semiconductor substrate 10a (such as the first electrode pad 11, the second electrode pad 12, the wiring line 23 or 24, and the integrated circuit block 17 or 19) are packaged by a sealing resin. It is desirable that a distance from the integrated circuit block 17 (or 19) to the first electrode pad 11 and a distance from the integrated circuit block 17 (or 19) to the second electrode pad 12 be approximately (or substantially) equal. The distance between the first lead terminal 61 and the second lead terminal 62 depends on the lead pitch of the package, usually within the range of 0.3 mm to 1.3 mm. The distance between the first electrode pad 11 and the second electrode pad 12 is generally within the range of 40 μm to 1.3 mm. The electrode pads of LSI chips are generally rectangular. The first electrode pad 11 and the second electrode pad 12 are also usually shaped like a rectangle of about 100 square μm. The layout of the analog filter IC 4 is not limited to the one shown in FIG. 3, and a variety of modifications are possible.

Figure 4:
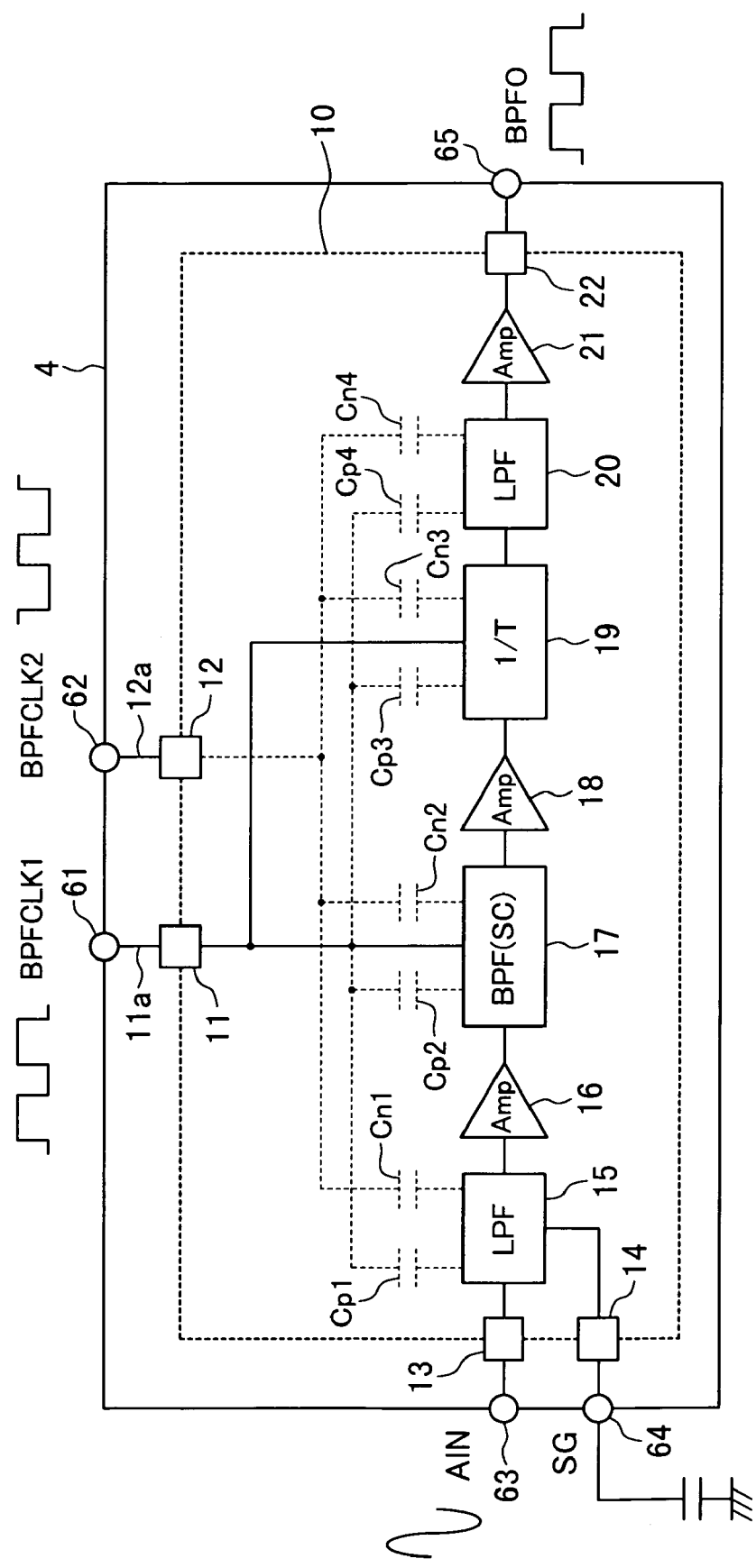
FIG. 4 is a diagram for describing parasitic capacitances in the analog filter IC shown in FIG. 2.

FIG. 4 is a diagram for describing parasitic capacitances in the analog filter IC shown in FIG. 2. In the analog filter IC 4 to which the first clock BPFCLK1 is supplied from the VICS logic IC 5, noise is caused by parasitic capacitances Cp1, Cp2, Cp3, and Cp4 between the electrode pad 11 of the IC chip 10 and the integrated circuit blocks 15, 17, 19, and 20 respectively, as shown in FIG. 4. This noise adversely affects the operating characteristics of the low-pass filters 15 and 20 and the band-pass filter 17. Especially, a large ill effect is given to a circuit including a capacitor which can temporarily float and has a relatively small capacitance. Therefore, the present invention provides the second electrode pad 12. The second electrode pad 12 is disposed in a position adjacent to the first electrode pad 11 on the semiconductor substrate 10a and is isolated from (that is, not connected to) the integrated circuit block. The second electrode pad 12 is supplied with the second clock BPFCLK2, which has the same frequency as and opposite polarity from the first clock BPFCLK1, through the second lead terminal 62 and the second bonding wire 12a from the VICS logic circuit 5. When the second clock BPFCLK2 is supplied, noise is caused by parasitic capacitances Cn1, Cn2, Cn3, and Cn4 between the second electrode pad 12 of the IC chip 10 and the integrated circuit blocks 15, 17, 19, and 20 respectively in the analog filter IC 4, as shown in FIG. 4. Noise caused by the first clock BPFCLK1 supplied to the first electrode pad 11 and noise caused by the second clock BPFCLK2 cancel out each other in the integrated circuit block. Therefore, noise of the digital signal BPFO output from the integrated circuit block can be reduced.

Figure 5:
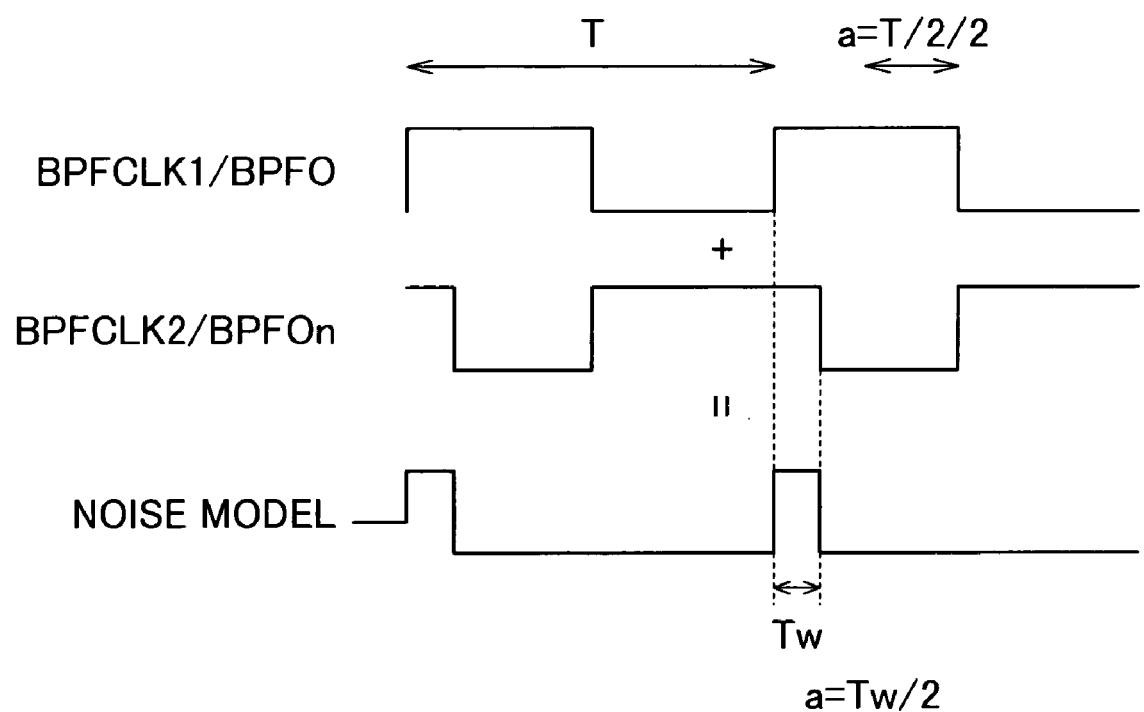
FIG. 5 is a waveform diagram for describing reduction of the effect of clock noise.
Figure 6:
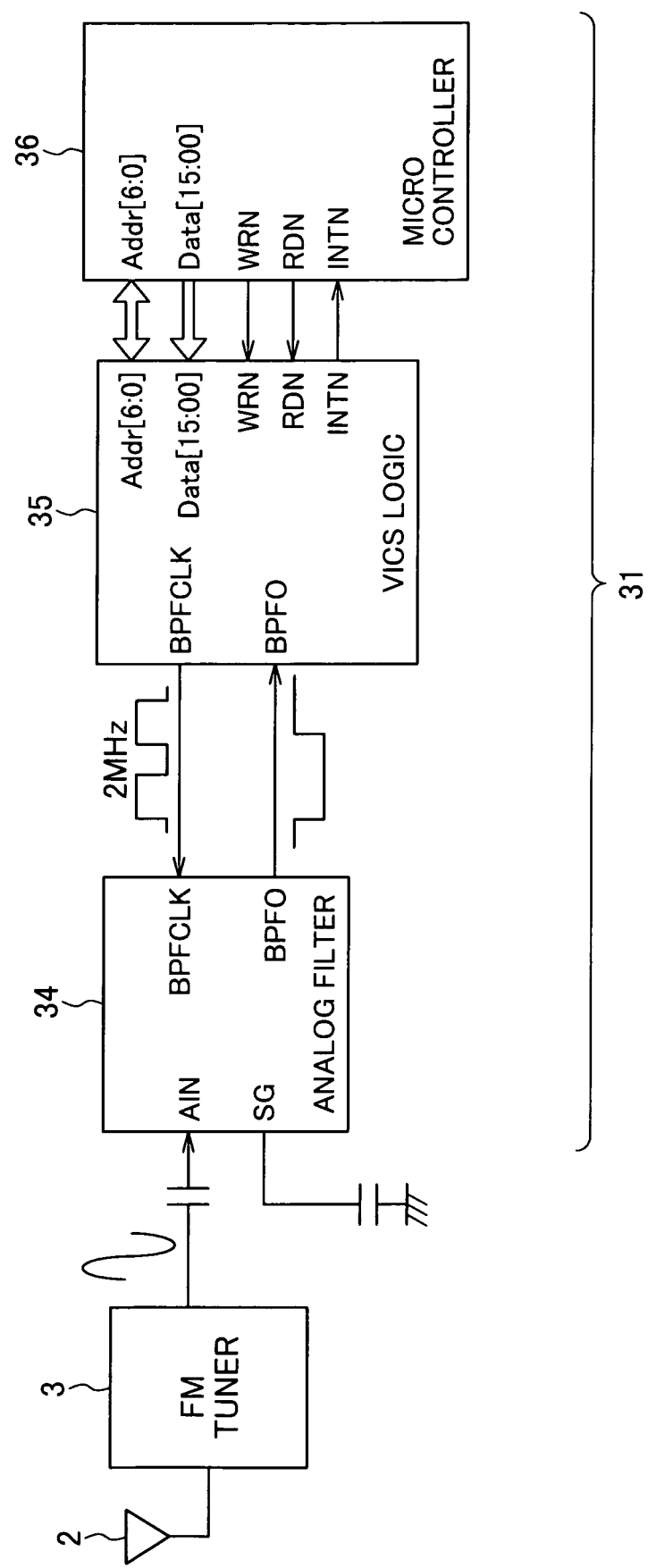
FIG. 6 is a diagram showing a configuration of a conventional FM multiplex broadcast receiver.
Figure 7:
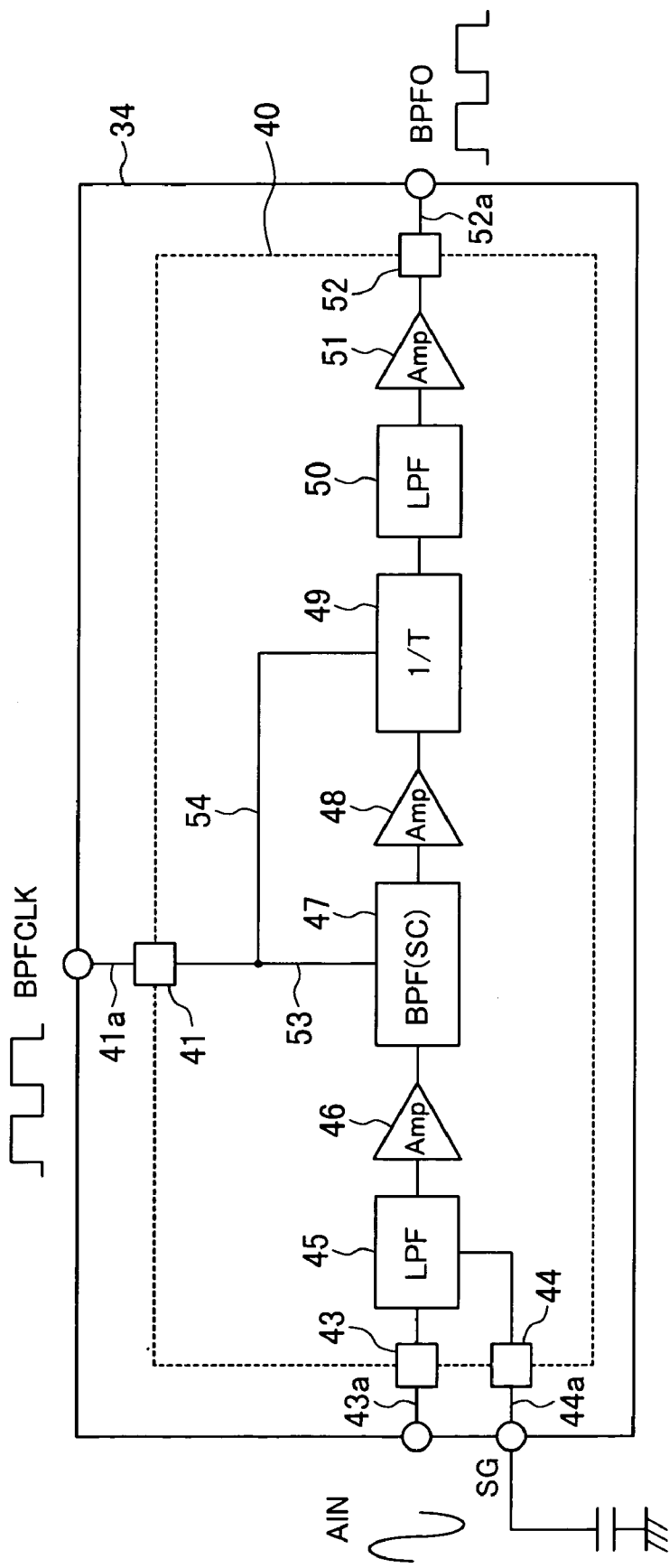
FIG. 7 is a diagram showing a configuration of the analog filter IC shown in FIG. 6.
Figure 8:
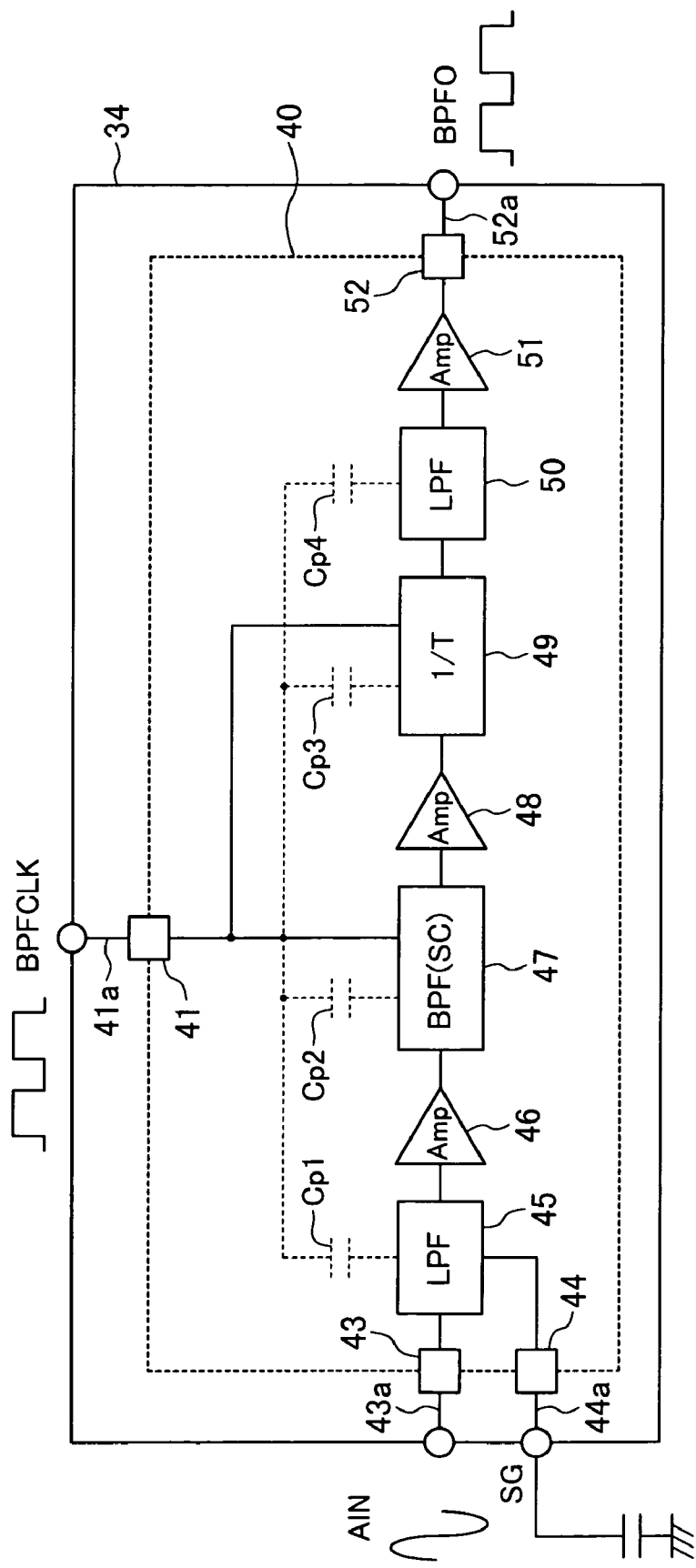
FIG. 8 is a diagram for describing parasitic capacitances in the analog filter IC shown in FIG. 7.

FIG. 5 is a waveform diagram for describing reduction of the effect of clock noise. The waveform shown at the top of FIG. 5 is of the first clock BPFCLK1 having a period of T (or of noise caused by the first clock BPFCLK1). The waveform shown in the middle of FIG. 5 is of the second clock BPFCLK2 having a period of T (or of noise caused by the second clock BPFCLK2). The waveform shown at the bottom of FIG. 5 is of a noise model produced after noise caused by the first clock BPFCLK1, shown at the top of FIG. 5, and noise caused by the second clock BPFCLK2, shown in the middle of FIG. 5, cancel out each other. Tw in FIG. 5 represents a delay time from the rising edge of the first clock BPFCLK1 to the falling edge of the second clock BPFCLK2. The delay time Tw equals a delay time caused by an inverter for inverting the first clock BPFCLK1 to generate the second clock BPFCLK2.

The waveforms shown in FIG. 5 can be represented by the following expression:

$$F(t)=\Sigma 2*\sin(2\pi*n*\alpha/T)/(2\pi*n)*\exp(j*n*\omega_0*t)$$

where $\exp(j*n*\omega_0*t)$ denotes a period. Because the first clock BPFCLK1 and the second clock BPFCLK2 shown in FIG. 5 have the same period, it is not necessary to calculate this term when comparing the waveforms shown at the top and at the bottom of FIG. 5.

Suppose that the waveform shown at the top of FIG. 5 has the following values:
T=500 ns (at a frequency of 2 MHz)
α=T/2/2=500/2/2
n=1 (at a frequency of 2 MHz)

Then, the following calculation can be made:

$$2*\sin(2\pi*n*\alpha/T) = 2*\sin(2\pi*1*(500/2/2)/500)$$
$$= 2*\sin(\pi/2)$$
$$= 2$$

Suppose that the waveform shown at the bottom of FIG. 5 has the following values:
T=500 ns (at a frequency of 2 MHz)
α=20/2 (with a delay of 20 ns)
n=1 (at a frequency of 2 MHz)

Then, the following calculation can be made:

$$2*\sin(2\pi*n*\alpha/T) = 2*\sin(2\pi*1*(20/2)/500)$$
$$= 0.125$$

These calculations tell that noise in the 2-MHz component without the input of the second clock BPFCLK2 and noise in the 2-MHz component with the input of the second clock BPFCLK2 have a ratio of 1:0.125. This indicates that the noise level is reduced by the input of the second clock BPFCLK2.

In the semiconductor integrated circuit device 4 and the FM multiplex data processing apparatus 1 of the embodiment of the present invention, noise in the integrated circuit blocks 15, 17, 19, and 20 caused by the first clock BPFCLK1 input to the first electrode pad 11 and noise in the integrated circuit blocks 15, 17, 19, and 20 caused by the second clock BPFCLK2 input to the second electrode pad 12 cancel out each other because the second clock BPFCLK2 has the same frequency as and opposite polarity from the first clock BPFCLK1, as has been described above. Accordingly, noise of the digital signal BPFO output from the integrated circuit block can be reduced.

The FM multiplex data processing apparatus 1 of the embodiment of the present invention can reduce noise of the output digital signal, so that the FM-signal reception sensitivity (reception range) can be improved.

An FM multiplex broadcast receiver using the FM multiplex data processing apparatus 1 of the embodiment of the present invention can reduce noise, so that the analog filter IC 4 can be disposed in the vicinity of the FM tuner 3 disposed on a VICS board (not shown), increasing flexibility in disposing a circuit on the VICS board. The FM tuner circuit (FM tuner 3) and the analog filter IC 4 can also be integrated into a single IC chip.

Although the semiconductor integrated circuit device has been described as the analog filter IC 4, the present invention can be applied to a circuit that receives an external clock. The present invention can further be applied to a signal processing apparatus other than the FM multiplex data processing apparatus 1.

The invention being thus described, it will be obvious that the same may be varied in many ways. Such variations are not to be regarded as a departure from the spirit and scope of the invention, and all such modifications as would be obvious to one skilled in the art are intended to be included within the scope of following claims.

What is claimed is:

1. A semiconductor integrated circuit device comprising:
a semiconductor substrate;
at least one integrated circuit block formed in the semiconductor substrate;
a first electrode pad which receives a first clock, the first electrode pad being disposed on the semiconductor substrate;
a wiring line which electrically connects the integrated circuit block and the first electrode pad, the wiring line being disposed on the semiconductor substrate; and
a second electrode pad which receives a second clock having the same frequency as and opposite polarity from the first clock, the second electrode pad being disposed in a position adjacent to the first electrode pad on the semiconductor substrate and isolated from the integrated circuit block.

2. The semiconductor integrated circuit device according to claim 1, wherein the second clock is an inversion of the first clock.

3. The semiconductor integrated circuit device according to claim 1, wherein a distance between the integrated circuit block and the first electrode pad and another distance between the integrated circuit block and the second electrode pad are approximately equal.

4. The semiconductor integrated circuit device according to claim 1, wherein
a plurality of the integrated circuit blocks are disposed on the semiconductor substrate and are connected through the wiring line to the first electrode pad;
one of the integrated circuit blocks is a first integrated circuit block having a band-pass filter function; and
another one of the integrated circuit blocks is a second integrated circuit block having a delay detection function.

5. The semiconductor integrated circuit device according to claim 1 further comprising:
a first lead terminal;
a first bonding wire which electrically connects the first lead terminal and the first electrode pad;
a second lead terminal; and
a second bonding wire which electrically connects the second lead terminal and the second electrode pad;
the first clock being supplied through the first lead terminal and the first bonding wire to the first electrode pad;
the second clock being supplied through the second lead terminal and the second bonding wire to the second electrode pad.

6. A signal processing apparatus comprising:
a first semiconductor integrated circuit device having the same structure as the semiconductor integrated circuit device according to claim 5;
a second semiconductor integrated circuit device which outputs the first clock and the second clock;
a first clock wiring line for supplying the first clock from the second semiconductor integrated circuit device to the first lead terminal of the first semiconductor integrated circuit device; and
a second clock wiring line for supplying the second clock from the second semiconductor integrated circuit device to the second lead terminal of the first semiconductor integrated circuit device.

7. An FM multiplex data processing apparatus comprising:
a first semiconductor integrated circuit device having the same structure as the semiconductor integrated circuit device according to claim 5;
a second semiconductor integrated circuit device which outputs the first clock and the second clock;
a first clock wiring line for supplying the first clock from the second semiconductor integrated circuit device to the first lead terminal of the first semiconductor integrated circuit device; and
a second clock wiring line for supplying the second clock from the second semiconductor integrated circuit device to the second lead terminal of the first semiconductor integrated circuit device;
the first semiconductor integrated circuit device including an analog filter circuit for extracting digital data from an FM baseband signal containing multiplex data;
the second semiconductor integrated circuit device including a decoder for decoding the digital data extracted by the analog filter circuit.

* * * * *